United States Patent [19]

Jordan

[11] 4,301,494

[45] Nov. 17, 1981

[54] PRINTED CIRCUIT BOARD FACEPLATE ASSEMBLY

[75] Inventor: Thomas W. Jordan, Berkeley, Ill.

[73] Assignee: Wescom, Inc., Downers Grove, Ill.

[21] Appl. No.: 79,709

[22] Filed: Sep. 28, 1979

[51] Int. Cl.³ .............................................. H05K 1/14
[52] U.S. Cl. ................................. 361/415; 339/45 M; 361/391; 361/399
[58] Field of Search ....................... 361/391, 399, 415; 339/457

[56] References Cited

U.S. PATENT DOCUMENTS

| | | | |
|---|---|---|---|
| 2,993,187 | 7/1961 | Bisbing | 361/415 |
| 3,575,482 | 4/1971 | MacMaster | 361/391 X |
| 3,577,113 | 5/1971 | Maitland | 339/45 M X |
| 3,760,486 | 9/1973 | Rifkin | 339/45 M X |
| 4,002,381 | 1/1977 | Wagner | 361/415 X |
| 4,064,551 | 12/1977 | Lightfoot | 361/399 |
| 4,083,616 | 4/1978 | McNiece | 339/45 M |

FOREIGN PATENT DOCUMENTS 2015828  9/1979  United Kingdom ................ 361/391

*Primary Examiner*—Richard R. Kucia
*Attorney, Agent, or Firm*—Roger N. Chauza; Howard R. Greenberg; H. Frederick Hamann

[57] ABSTRACT

A faceplate assembly is provided for use in printed circuit board assemblies comprising a printed circuit board with electrical contact surfaces, and a housing frame with slotted guide rails to receive the circuit board, and edge connector means fastened to the housing frame and displaced at the end of the guide rails. The faceplate assembly includes insertion, extraction and positive latching means molded as an integral part of the faceplate. The faceplate body extends substantially the entire length of the printed circuit board edge and is pivotally mounted to the printed circuit board near one corner thereof. The insertion/extraction means, located on the pivotal end of the faceplate body, is actuated by manual pivotal movement of the faceplate thereby causing the insertion/extraction means to coact with a housing frame U-channel to thus effect engagement or disengagement of the printed circuit board electrical contacts to or from the housing frame edge connector contacts. Final pivotal movement of the faceplate body, directed toward the printed circuit board edge to effect engagement of the corresponding electrical contacts, activates the positive latching means located on the faceplate at the end opposite the insertion/extraction means to thereby positively lock the board and housing frame electrical contacts into a mated position.

10 Claims, 7 Drawing Figures

PRINTED CIRCUIT BOARD FACEPLATE ASSEMBLY

BACKGROUND OF THE INVENTION

The present invention generally relates to the electronic packaging technology, and is particularly directed to printed circuit board assemblies, attached faceplates, and printed circuit board insertion and extraction and latching means associated therewith.

The electronics packaging industry has been revolutionized with the advent of the printed circuit board. By most accounts, electrically conductive path etching techniques, miniaturization of electronic components, and multi-layer printed circuit board techniques have had a profound affect on the industry by enabling families of electronic functions to be placed on a single circuit board. Further, printed circuit boards themselves may be mechanically grouped together by slidably inserting a multiplicity of such boards into rigid housing frames, the overall purpose of which is to provide a package which may perform an entire system function.

It is well known in the art that early vintage "circuit packs", i.e. printed circuit board assemblies, included full metal or plastic faceplates rigidly affixed to the circuit board to provide a mechanical protective cover which prevented foreign objects such as wire or tools from being inadvertently projected into the circuitry. This full faceplate concept proved to be difficult to use, particularly in effecting a rapid removal of the boards, and was abandoned in favor of finger-operated insertion and extraction means mounted to the circuit board. This insertion/extraction mechanism enabled a repairman or operator to easily insert or extract the circuit pack with minimum physical force, although the protective qualities the older full faceplates were lost. The art now comprises of various single or double lever finger-operated insertion extraction means in addition to various other complicated cam-operated mechanisms.

Heretofore, no effort or attempt has been made in the prior art to combine all the advantages of a full faceplate together with the ease of board removal and handling associated with finger operated insertion/extraction means.

SUMMARY OF THE INVENTION

With the foregoing in mind it is the primary objective of the present invention to provide a printed circuit board assembly having many of the protective advantages of full frontal mechanical protection, the handling advantages of finger operated insertion and extraction means, and a latching means for reliability all disposed on one simple and easily manufactured faceplate.

A more specific object of the invention is to provide a circuit pack faceplate that extends substantially the entire edge of the circuit board and which has insertion/extraction and latching means molded as a part thereof.

A more detailed object of the invention is to provide a full circuit board faceplate that is pivotally movable about one corner of the circuit board to thereby actuate the insertion/extraction and latching means.

Yet another objective of the instant invention is the provision of a feature whereby an unlatched faceplate defines a means to visually detect when one of a plurality of circuit boards is inserted within a housing frame yet not positively seated within its edge connector.

It is yet another object of the instant invention to provide apparatus whereby, if the circuit board is inadvertently left in an unlatched condition, the force exerted by gravity on the lever arm of the extended faceplate forces the circuit board in a direction to maintain circuit board engagement within the edge connector thereby overcoming vibrational forces tending to disengage the board from the connector.

Still another object of the instant invention is to provide a means to activate the insertion/extraction and latching means of the circuit board by one simple continuous movement of the faceplate.

As a corollary to the foregoing, it is an object of the invention to provide, as part of the faceplate, an element whereby the manual pressure applied thereto serves to effect maximum force to lock or unlock the latching machanism and additionally effects maximum force on the insertion/extraction means to thereby engage or disengage the corresponding electrical contacts.

BRIEF DESCRIPTION OF THE DRAWINGS

The invention itself will be better understood and further objectives and advantages will become apparent when the following detailed description is read in conjunction with the attached drawings, in which.

DETAILED DESCRIPTION OF THE ILLUSTRATED EMBODIMENT

Figure 1:
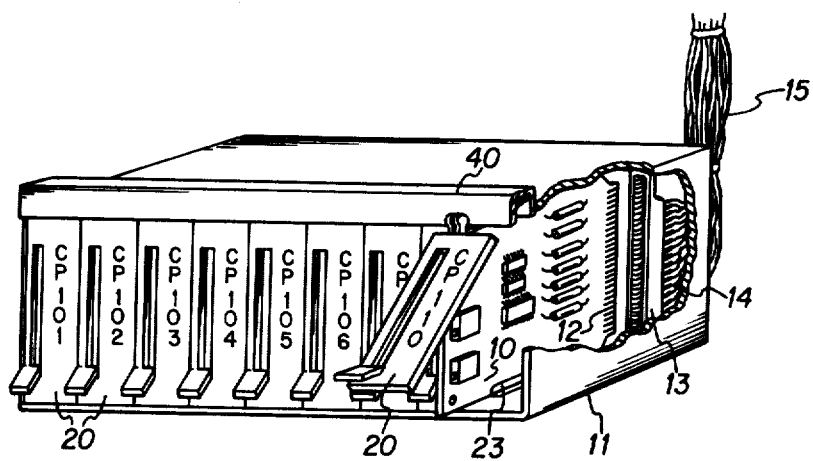
FIG. 1 is a perspective view of the printed circuit board assembly providing an exemplary environment for the present invention. A portion of the housing frame is shown cut out to emphasize the circuit board/edge connector relationship.

Turning now to the drawings, and particularly to FIG. 1, there is shown a printed circuit board assembly which will serve as an exemplary environment for the printed circuit board and the associated faceplate, insertion/extraction means, and the latching means.

In the illustrated form of the invention, a printed circuit board 10 is shown as part of a collection of similar boards the purpose of which is to form a system of electronic functions. Various other electronic functions may be added to this system simply by adding additional circuit boards. Each housing frame 11 is rigidly constructed with two opposing surfaces employing channeled or slotted guide rail means 23 to accommodate a multiplicity of printed circuit boards that may be manually slideably inserted or extracted therefrom. The majority of the illustrated circuit boards are shown in the inserted position within the housing frame where circuit board electrical contact surfaces 12 are caused to forcefully mate with a housing frame edge connector 13 thereby providing electrical signal continuity between the board circuitry and the exterior world. Further shown in FIG. 1 are housing frame edge connector wire wrap pins 14 through which circuit board electrical signals are conducted to the exterior world via a wire harness 15. In the illustrated embodiment, the printed circuit board 10 is shown being extracted from the housing frame after manual pivotal force has been applied to its faceplate 20 thereby disengaging the circuit board contacts from the associated mating edge connector.

Figure 2:
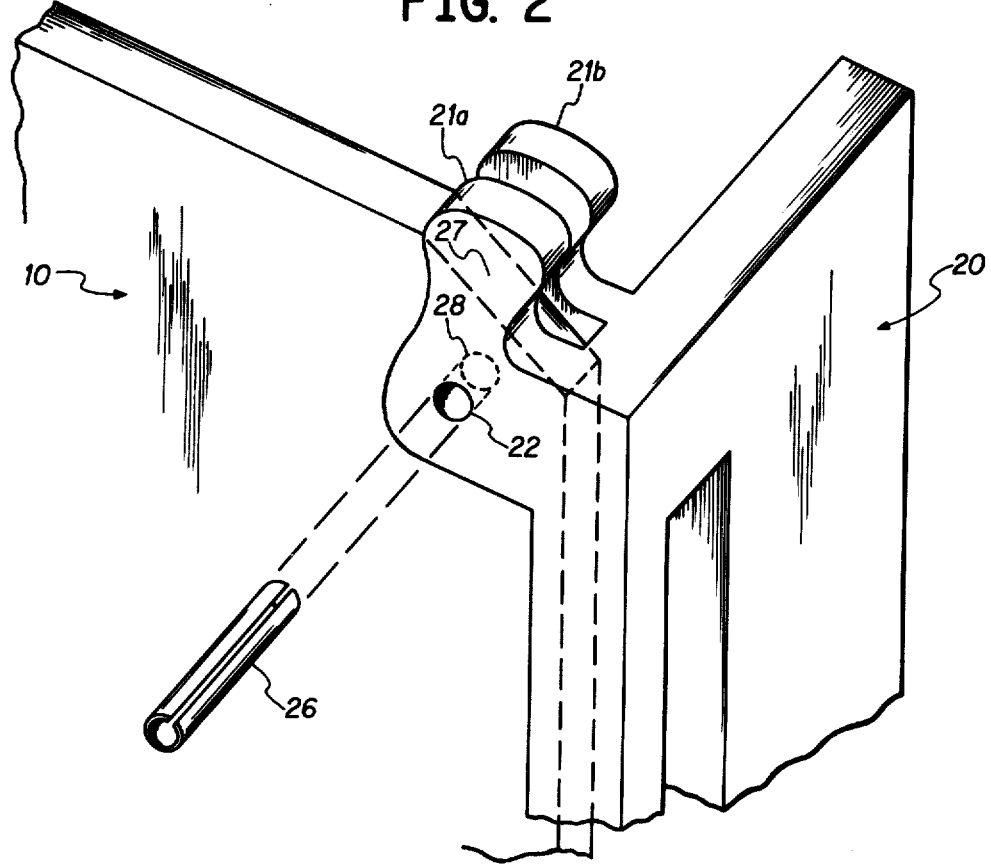
FIG. 2 is a partial perspective view of the faceplate insertion/extraction means as molded to the body of the faceplate and further illustrates in detail the shape thereof and the location of the pivotal axis of the faceplate.

Turning now to FIG. 2, there is shown a portion of the printed circuit board faceplate 20 as it is connected at the corner of the circuit board 10. The rigid faceplate, being mounted at only one point on the circuit board, is molded from a fiber glass filled polyester or glass-filled nylon. Other materials having qualities of rigidity and durability may of course, be used. Also shown in FIG. 2 are the insertion/extraction members 21a, 21b which are molded as part of the faceplate 20. The insertion/extraction members 21a, 21b are molded an integral circuit board width apart so as to accommodate the printed circuit board 10 by straddling it at the corner. Within the dog-leg portion of each insertion/extraction member there is molded a hole at position 22 which is aligned with a similarly situated hole 28 in the circuit board 10. The hole disposed of in the circuit board 10 is slightly larger than the hole formed in the insertion/extraction members in order that the circuit board will freely pivot about the split metal pin 26 that is press-fitted into the dog-leg portion of the members 21a and 21b. As will be discussed later, the insertion/extraction members are shaped to coact with the two opposing inner surfaces of the housing frame U-channel 40 (FIG. 1) in order to effectuate the insertion and withdrawal of the circuit board from the housing frame connector. Further shown in FIG. 2 is the hidden corner 27 of the circuit board 10 which is cut diagonally thereby allowing the faceplate 20 to be freely pivoted about the corner of the circuit board.

Figure 3:
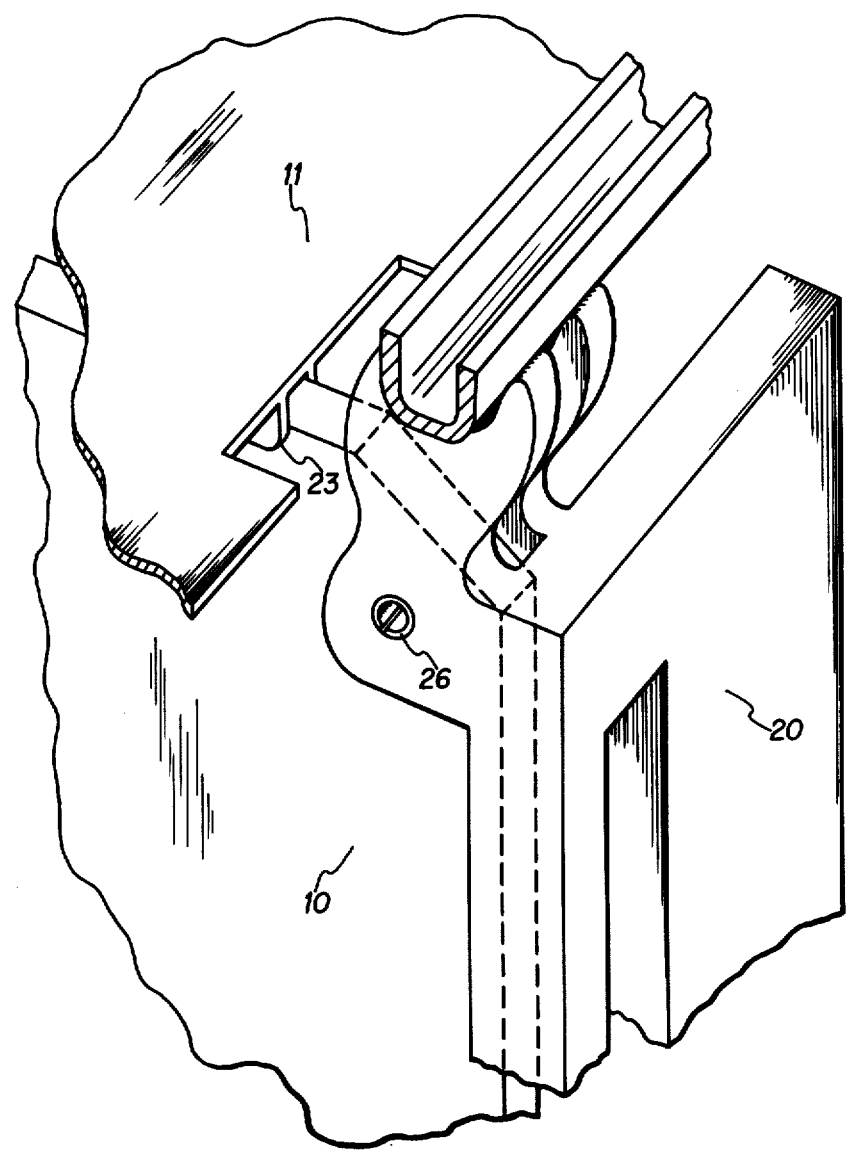
FIG. 3 is a partial view of an alternate insertion/extraction mechanism and the respective coacting surfaces as affixed to the housing frame.

As an alternative to the aforementioned insertion/extraction means, there is shown in FIG. 3 a mechanism wherein the insertion/extraction male elements and the housing frame female elements are interchanged. While the coacting surface shapes may not be mirror images of the insertion/extraction means as described in the preferred embodiment, all the advantages flowing therefrom also exist in the alternative embodiment. As will be appreciated by those familiar with this art, the insertion/extraction means described herein are well known in the art and thus do not in and of themselves represent any part of the novelty of the present invention.

Figure 4:
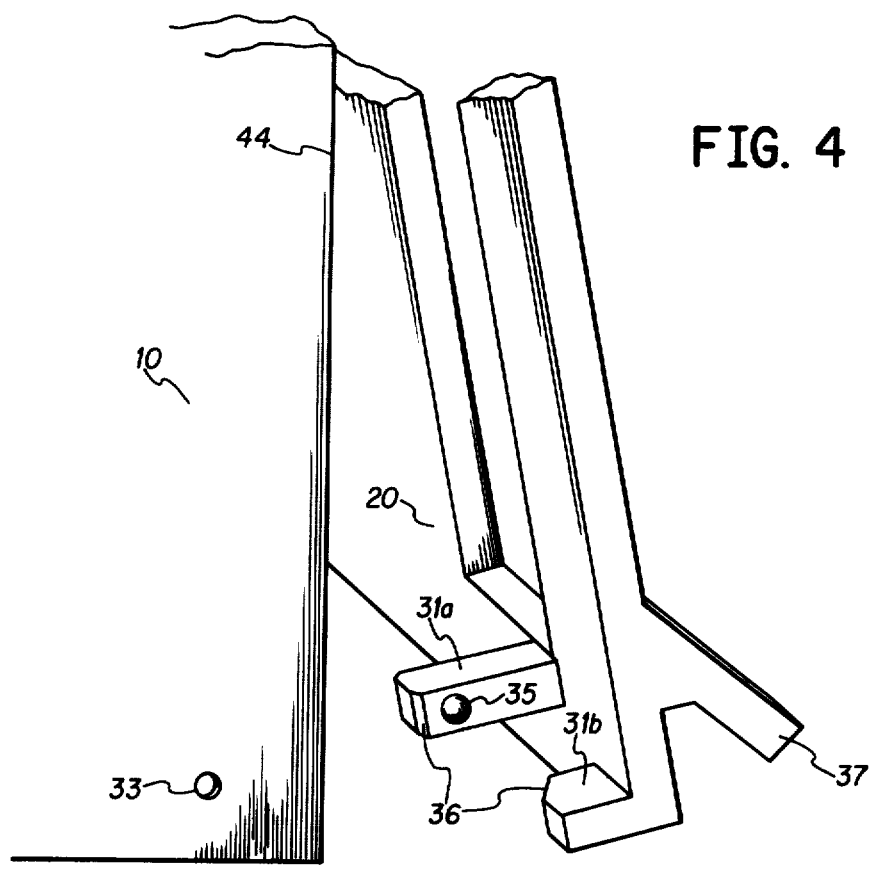
FIG. 4 is a partial view illustrating the elements of the latching means as molded on the faceplate and the corresponding hole in the circuit board.

Referring now to FIG. 4 there is illustrated the latching means members 31a and 31b molded as part of the faceplate. The latching members are positioned on the faceplate body 20 at the end opposite the insertion/extraction means. In order to reduce machining and manufacturing costs, a hole 33 is positioned in circuit board 10 of the same size as that drilled in the circuit boards at position 28 (FIG. 2), the latter which accommodate pivotal movement of the faceplate. In addition, and for cost reduction purposes, the holes at positions 28 and 33 are drilled at the same relative positions away from the edges of the circuit board.

FIG. 4 also depicts the latching members 31a and 31b extending away from the faceplate 20 and again as with the insertion/extraction means, spaced an integral board width apart to straddle the circuit board 10. The latching members 31a and 31b are chamfered at 36 to automatically align themselves on each side of the circuit board. Also molded as a part of member 31a is a convex surface 35 positioned to mate with the hole 33 in the circuit board. As depicted in FIG. 4 member 31b is shorter than member 31a in addition to being vertically offset thereto. The relative vertical position of member 31b and its length with respect to member 31a are relevant to the latching function only so far as ease of manufacture is concerned. The molding steps and apparatus needed to form the convex surface 35 are simplified when the members are as shown in FIG. 4.

Other vertical positions and lengths of the member 31b may be utilized without departing from the scope and spirit of the invention. Still other variations may encompass dual members 31a, 31b each having a convex surface, or the board having the convex surface while one or both members have concave surfaces. While the latching means as depicted in FIG. 4, is discussed only in connection with the preferred embodiment, other latching means may be utilized as may fall within the scope of the appended claims.

As will be discussed hereinafter, it will be seen that because of the connection of the faceplate panel 20 to the corresponding insertion/extraction elements 21a, 21b (FIG. 2), the faceplate necessarily has to pivot outwardly in order for the circuit board to be removed from the housing frame. In like manner, and according to an object of this invention, the last act of engaging a circuit board into the frame edge connector is the manual pivotal force applied to the faceplate in a direction to seat the circuit board contacts into the edge connector. This last act of electrical contact engagement also has the affect of causing the latching members 31a and 31b to straddle the board such that the convex surface 35 on member 31a slideably frictionally mates with the void of the circuit board hole 33. More specifically, as manual force is applied to member 37 in a direction forcing the members 31a, 31b to straddle the circuit board, the members being about a board width apart are further forcefully separated in order to accommodate the additional thickness of the convex surface 35. The circuit board contact 12 hole 33 is positioned an integral distance from the leading edge of the board such that when the faceplate body 20 is flush against the board edge, the convex surface 35 frictionally mates with the circuit board hole 33.

The overall effect of these last-mentioned actions is to lock the faceplate into a position immovable with respect to the circuit board and thus prevent any unintentional movement of the circuit board in a direction tending to disengage the board's electrical contacts from the edge connector contacts. Without some type of latching mechanism to keep the circuit board captured within the edge connectors, such circuit boards have been known to become expelled from the edge connectors. This undesired result is due to the vibrational forces and the edge connector 13 contact spring tension being constantly exerted on the circuit board contacts 12.

Figure 6:
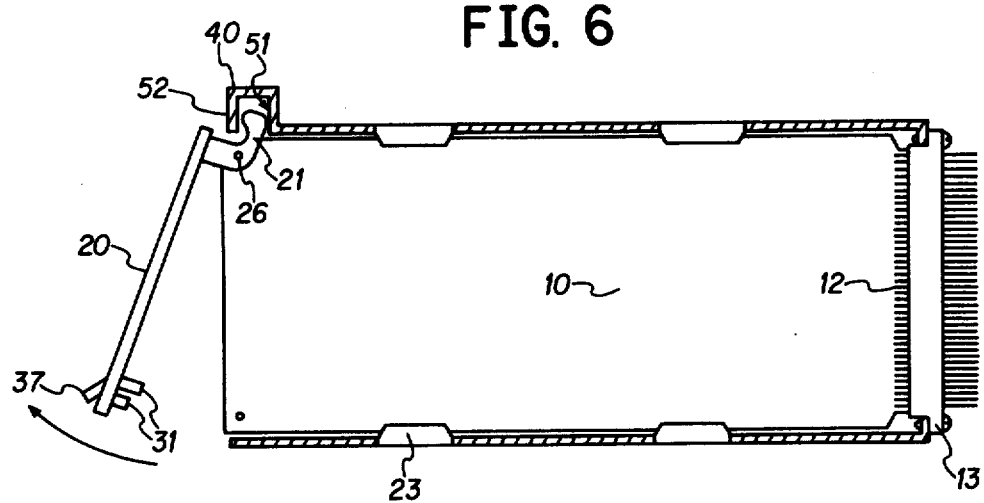
FIG. 6 is a side view of the printed circuit board illustrating pivotal movement of the faceplate in a direction to effect a disengagement of the circuit board contacts from the corresponding mating edge connector.

As previously noted the printed circuit board and housing frame edge connector are fully mated only when the faceplate body 20 is fully flush against the circuit board leading edge 44 and thus latched thereto. Keeping this in mind, and additionally noting that the normal undisturbed state of a functioning electronic system is with all the circuit boards fully inserted, i.e., the mating contacts fully mated, it is further noted that in the normal course of troubleshooting defective circuitry, a serviceman or repairman may disengage a circuit board slightly to ascertain the effect on the system. In accordance with an object of the present invention the detection of a disengaged circuit board is easily made by the serviceman. As indicated in FIG. 1, all inserted circuit boards provide a uniform frontal surface area, while a disengaged, but not fully extracted circuit board as depicted in FIG. 6, to be fully discussed later, is easily detected by the outwardly extended large faceplate. Thus, a serviceman, upon returning to reengage the circuit board may easily find the one he had previously disengaged.

Referring again to FIG. 4, the protruding element 37 is appropriately molded on the faceplate 20 on the side opposing the latching means. The placement of the element 37 is conveniently placed such that minimum finger pressure advantageously provides the dual function of applying the maximum force on the latching means to overcome the frictional forces to lock or unlock the faceplate to or from the circuit board; and applying maximum pressure, through the lever arm of the faceplate, to the insertion/extraction means to engage or disengage the board electrical contacts to or from the housing edge connector.

Figure 5:
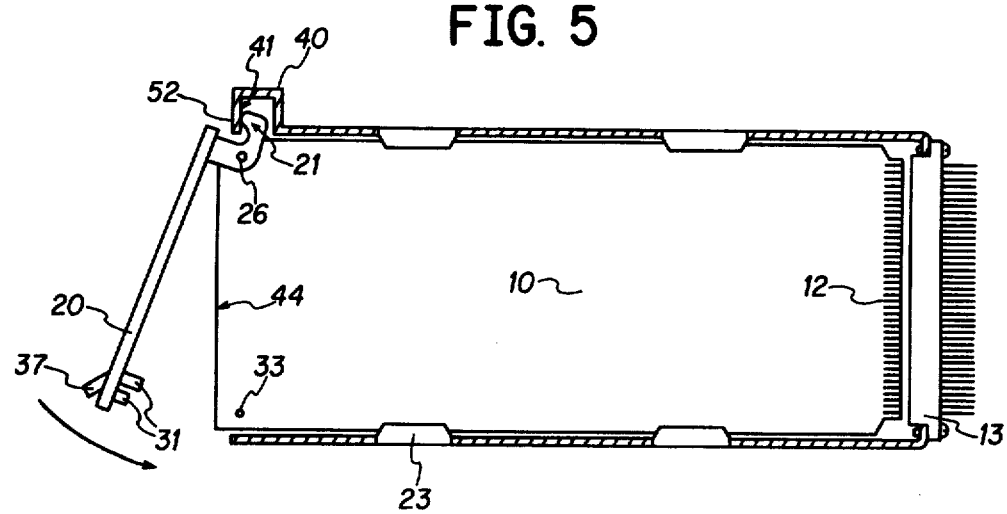
FIG. 5 is a generalized side view of the printed circuit board assembly showing the coaction between the insertion means and the housing frame to effect an engagement of the circuit board electrical contacts into the mating edge connector.

FIG. 5 is an overall side view of the circuit board as it is being slideable inserted into the edge connector 13 by pivotal movement of the faceplate 20 toward the circuit board leading edge 44. As the circuit board contact surfaces 12 approach the edge connector 13, the faceplate must be in a near horizontal position in order that the insertion/extraction element 21 clears the frontal U-channel edge 52. After the insertion/extraction element 21 is generally within the U-channel opening, the faceplate is manually pivotally rotated in a direction toward the circuit board leading edge 44. In this manner, and as depicted in FIG. 5, the frontal edge of the insertion/extraction element 21 coacts with the inner U-channel surfae 41 such that the pivotal force applied to the faceplate 20 forces the circuit board in a direction to effectuate board contact engagement into the edge connector 13.

It is worthy to point out here that an unlatched and extended faceplate 20 acted upon by the downward gravitational force advantageously provides a lateral force acting in a direction to keep the respective mating connection contacts engaged. In this manner, a connector contact connection that is not fully mated, because a craftsman inadvertently failed to latch the faceplate 20 to the circuit board 10, may maintain contact where it otherwise would work loose because of vibration. As heretofore mentioned, maximum pivotal movement of the faceplate toward and against the circuit board edge accomplishes total circuit board contact engagement within the edge connector and simultaneous locking of the latching means to the board. Thus, it can be seen that the single continuous movement of the faceplate has the advantage of accomplishing both board engagement within the edge connector and the positive locking of the two together.

Summarizing, it is observed that the insertion of a circuit board 10 into the housing frame is a simple operation consisting of the manual movement of the board in the slotted guide rails 23 toward the mating edge connector 13 with the faceplate in a near horizontal position until the insertion/extraction element 21 enters the U-channel 40 opening. At this time, the pivotal movement of the faceplate toward the circuit board edge 44 seats the circuit board into the edge connector and at the same time the latching means frictionally locks the faceplate to the circuit board to thereby prevent lateral movement of the circuit board thus overcoming any tendency of the board/housing connector contacts to become disengaged.

The steps necessary to remove the circuit board from the housing frame and thus from the edge connector contacts are the same steps necessary to effectuate insertion, except the steps are executed in the reverse order.

Viewing FIG. 6, it can be seen that the application of manual force on the faceplate lever element 37 in a direction to force the faceplate away from the circuit board edge (shown by the arrow) will disengage the circuit board contacts 12 from the corresponding edge connector 13 contacts. More particularly, the insertion/extraction element 21 coacts with the opposite inside U-channel surface 51 thereby causing lateral movement of circuit board in a direction tending to disengage the circuit board contacts 12 from the edge connector contacts. The manual pivotal force applied to the faceplate which forces the insertion/extraction element to coact with the inside U-channel surfce 51 is transmitted from rotational force exerted at the split pin 26 to horiizontal lateral movement. As the faceplate 20 is rotated to a near horizontal position, the circuit board contacts are completely disengaged from the edge connector contacts. In addition, the insertion/extraction element 21 is then in a position to clear the frontal U-channel edge 52 and thus the circuit board may be fully extracted via the slotted guide rails 23 from the housing frame.

Again, it is seen that the simple continuous movement of the faceplate, acting through its lever arm, about its axial connection to the circuit board can overcome the large force necessary to remove a multicontact circuit board from its mating connector. It is also seen that the simple continuous motion of inserting the circuit board simultaneously positively latches the board into the housing frame and thus prevents any lateral movement of the board except for the intentional removal thereof.

In keeping with one of the more detailed features of the present invention, it will be seen that the full faceplate frontal area is not sacrificed in favor of insertion/extraction and latching advantages. On the contrary, the present invention incorporates these three elements into a single easily constructed piece that is easily mounted at one point into the circuit board. This aspect represents a dual advantage in that substantial savings in machining and labor are realized while yet adding features to the product.

Figure 7:
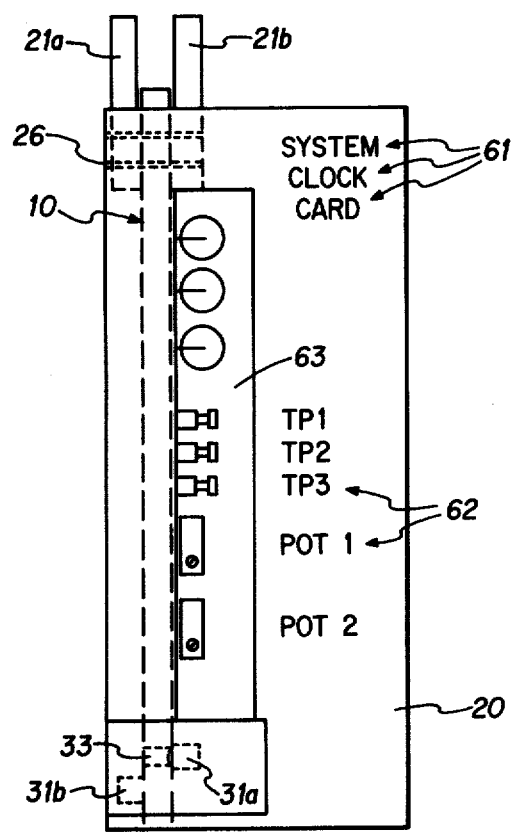
FIG. 7 is a frontal view of the printed circuit board faceplate body illustrating the details and features of the frontal area thereof in relation to the circuit board and its attached electrical components.

Referring to FIG. 7, and as noted heretofore, the present invention retains the advantages of the full frontal faceplate area thereby protecting the internal circuitry from interference by foreign objects. Viewing again FIG. 1 it is observed that when all of the circuit boards are in the inseted position the combined faceplate areas afford mechanical protection to the entire housing frame opening. While the embodiment of the present invention discloses an aperature 63 (FIG. 7) in the faceplate 20, is not necessary and need not compromise the advantages of the invention. If maximum mechanical frontal area protection is desired, the faceplate 20 may be formed having no aperature opening. On the other hand, a narrow aperature opening has the advantages of: allowing air to circulate through the housing frame to cool the components; providing access to those components at the front of the circuit board for test purposes; providing a means to insert an adjustment tool to make electrical adjustments on potentiometers, capacitors, inductors and the like.

In furtherance of other aspects of the present invention, FIG. 7 depicts at 61 the availability of a large frontal area to imprint or silk screen the circuit board function. This is advantageous over the prior art wherein such insertion/extraction means frontal area was sufficient to indicate at most a circuit pack number or abbreviated description. In addition, FIG. 7, shows at 62 that sufficient frontal area exists to imprint indications of test points and adjustment points that correspond to the actual test and adjustment points on the circuit board accessible through the aperature opening 63.

From the foregoing, it will now be seen that the present invention provides all the advantages of insertion/extraction means, latching means, and full frontal faceplate area all molded into a one-piece plastic construction and pivotally mounted to the circuit board at one point.

Further modifications are of course, possible and will occur to those skilled in the art. Such modifications falling within the spirit and scope of the appended claims will be construed as being part of the present invention. It should now be apparent that the objectives set forth at the outset of this specification have been successfully achieved. Accordingly:

What I claim is:

1. A latching faceplate assembly for use in combination with each of a plurality of spaced apart printed circuit boards and a housing into which said boards are inserted, said assembly comprising:

a channel formed along a frontal edge of the housing transverse to the boards contained within said housing, and a planar member for each board which extends substantially the entire length of the frontal edge thereof and projecting laterally from said frontal edge an amount sufficient to fill the interboard spacing so as to essentially close the housing frontal opening thereby protecting the housing contents, said planar member being pivotally mounted at one end thereof to a corner of said board, said planar member having an extended portion at its pivotal end which engages said channel so as to exert a lateral force on said board to aid board insertion into said housing when said planar member is pivoted toward the board edge and so that an opposite lateral force is exerted to aid extraction when said planar member is pivoted away therefrom.

2. The faceplate assembly of claim 1 wherein said channel is comprised of a U-channel and the planar member pivotal movement causes said extended portions to coact with the inner surfaces of said U-channel to thereby effect lateral board movement.

3. The faceplate assembly of claim 1 wherein said channel is comprised of a U-channel and the planar member pivotal movement causes said extended portions to coact with the outer surfaces of said U-channel to thereby effect lateral board movement.

4. The faceplate assembly of claim 2 or 3 wherein said extended portions comprise two similarly-shaped members straddling said board.

5. The faceplate assembly of claim 1 wherein said planar member includes latching means on the end opposite said pivotal end, said latching means being responsive to planar member pivotal movement toward said board edge for locking said board in an engaged position within said housing.

6. The faceplate assembly of claim 5 wherein in the locked position, a portion of said latching means straddles said board and the contiguous areas of said board and latching means include complementary surfaces frictionally mating so that said planar member is locked to said board.

7. The faceplate assembly of claim 6 wherein the latching means complementary surface comprises a convex-shaped surface and the board complementary surface comprises a complementary sized hole.

8. The faceplate assembly of claim 5 above in said extended portion aiding insertion and extraction and said latching means are formed as an integral part of the planar member thereby allowing a single pivotal movement to effect unlatching and extraction or insertion and latching.

9. The faceplate assembly of claim 8 wherein said extended portion, the planar member and the latching means are molded as an integral unit out of plastic so that the manufacture thereof is effected in one operation.

10. The faceplate assembly of claim 5 wherein the pivotal end of said planar member is pivotal about the top corner of said board so that the mass of said planar member defines a cantilevered weight which when acted upon by gravity exerts a continuous lateral force upon said board in a direction to resist extraction when said board is engaged yet not latched.

* * * * *